(12) United States Patent
Kang et al.

(10) Patent No.: US 12,147,132 B2
(45) Date of Patent: Nov. 19, 2024

(54) DISPLAY DEVICE

(71) Applicant: Samsung Display Co., Ltd., Yongin-si (KR)

(72) Inventors: Hyeon Cheol Kang, Seoul (KR); Soo San Mun, Gwangju (KR); Yong Seok Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/128,100

(22) Filed: Mar. 29, 2023

(65) Prior Publication Data

US 2023/0244111 A1 Aug. 3, 2023

Related U.S. Application Data

(62) Division of application No. 17/065,894, filed on Oct. 8, 2020, now Pat. No. 11,650,466, which is a division
(Continued)

(30) Foreign Application Priority Data

Apr. 20, 2018 (KR) ........................ 10-2018-0046327

(51) Int. Cl.
*G02F 1/136* (2006.01)
*G02F 1/1362* (2006.01)
(Continued)

(52) U.S. Cl.
CPC .. *G02F 1/136204* (2013.01); *G02F 1/136259* (2013.01); *G02F 1/136286* (2013.01);
(Continued)

(58) Field of Classification Search
CPC ........... H01L 27/0296; G02F 1/136204; G02F 1/136286; G02F 1/1368
(Continued)

(56) References Cited

U.S. PATENT DOCUMENTS 6,697,037 B1 2/2004 Alt et al.
7,923,728 B2 4/2011 Lim et al.
(Continued)

FOREIGN PATENT DOCUMENTS

KR 10-2008-0070149 7/2008
KR 10-0864410 10/2008
(Continued)

OTHER PUBLICATIONS

Non-Final Office Action dated Feb. 14, 2020, issued to U.S. Appl. No. 16/215,595.
(Continued)

*Primary Examiner* — Dzung Tran
(74) *Attorney, Agent, or Firm* — CANTOR COLBURN LLP

(57) ABSTRACT

A display device includes a substrate, a first data fan-out line disposed on the substrate, a first data line disposed on the first data fan-out line and comprising a repair area overlapping the first data fan-out line, a color filter disposed on the first data line and overlapping the repair area, and a connection electrode disposed in the repair area and being in direct contact with the first data fan-out line and the first data line.

7 Claims, 10 Drawing Sheets

Related U.S. Application Data of application No. 16/215,595, filed on Dec. 10, 2018, now Pat. No. 10,802,360.

(51) Int. Cl.
*G02F 1/1368* (2006.01)
*H01L 27/02* (2006.01)
*H01L 27/12* (2006.01)
*G09G 3/36* (2006.01)

(52) U.S. Cl.
CPC ........ *G02F 1/1368* (2013.01); *H01L 27/0296* (2013.01); *H01L 27/1244* (2013.01); *G02F 1/136222* (2021.01); *G02F 1/136227* (2013.01); *G02F 1/136263* (2021.01); *G02F 2201/121* (2013.01); *G09G 3/3677* (2013.01); *G09G 3/3688* (2013.01)

(58) Field of Classification Search
USPC .......................................... 257/72
See application file for complete search history.

(56) References Cited

U.S. PATENT DOCUMENTS

| | | | |
|---|---|---|---|
| 8,865,533 | B2 | 10/2014 | Lim et al. |
| 9,075,268 | B2 | 7/2015 | Eun et al. |
| 9,985,053 | B2 | 5/2018 | Kim et al. |
| 2002/0089634 | A1 | 7/2002 | Aruga et al. |
| 2004/0263765 | A1 | 12/2004 | Han et al. |
| 2006/0138426 | A1 | 6/2006 | Yoo et al. |
| 2007/0002243 | A1 | 1/2007 | Kim |
| 2007/0040794 | A1 | 2/2007 | Kwak et al. |
| 2008/0158127 | A1 | 7/2008 | Chang et al. |
| 2014/0176838 | A1 | 6/2014 | Hong et al. |
| 2016/0306212 | A1 | 10/2016 | Lim |
| 2017/0010497 | A1 | 1/2017 | Kim et al. |
| 2017/0047347 | A1* | 2/2017 | Kim ................ H01L 27/124 |
| 2017/0068122 | A1 | 3/2017 | Kim et al. |
| 2017/0146868 | A1 | 5/2017 | Chang |
| 2017/0288005 | A1* | 10/2017 | Kawata ............. H01L 27/1248 |
| 2017/0317110 | A1 | 11/2017 | Lee et al. |
| 2018/0059449 | A1 | 3/2018 | Kim |
| 2019/0179192 | A1 | 6/2019 | Lee et al. |

FOREIGN PATENT DOCUMENTS

| | | |
|---|---|---|
| KR | 10-2016-0124981 | 10/2016 |
| KR | 10-2017-0020640 | 2/2017 |

OTHER PUBLICATIONS

Notice of Allowance dated Jun. 9, 2020, issued to U.S. Appl. No. 16/215,595.
Non-Final Office Action dated Jun. 14, 2022, issued to U.S. Appl. No. 17/065,894.
Final Office Action dated Sep. 21, 2022, issued to U.S. Appl. No. 17/065,894.
Advisory Action dated Nov. 30, 2022, issued to U.S. Appl. No. 17/065,894.
Notice of Allowance dated Jan. 11, 2023, issued to U.S. Appl. No. 17/065,894.
Corrected Notice of Allowability dated Feb. 28, 2023, issued to U.S. Appl. No. 17/065,894.

* cited by examiner

DISPLAY DEVICE

CROSS REFERENCE TO RELATED APPLICATION

This application is divisional of U.S. patent application Ser. No. 17/065,894, filed Oct. 8, 2020, which is a divisional of U.S. patent application Ser. No. 16/215,595 filed on Dec. 10, 2018, now issued as U.S. Pat. No. 10,802,360, which claims priority from and the benefit of Korean Patent Application No. 10-2018-0046327, filed on Apr. 20, 2018, which is hereby incorporated by reference for all purposes as if fully set forth herein.

BACKGROUND

Field

The invention generally relates to a display device.

Discussion of the Background

The importance of a display device has increased with the development of multimedia. Accordingly, various types of display devices such as a liquid crystal display (LCD) and an organic light emitting display (OLED) have been used.

Among display devices, a liquid crystal display device, which is one of the most widely used flat panel display devices, includes two substrates including electric field generating electrodes such as a pixel electrode and a common electrode and a liquid crystal layer disposed therebetween. In the liquid crystal display device, a voltage is applied to the electric field generating electrodes to form an electric field in the liquid crystal layer, so that the alignment of liquid crystal molecules in the liquid crystal layer is determined, and the polarization of incident light is controlled, thereby displaying an image.

Among display devices, an organic light emitting display device displays an image using an organic light emitting element that emits light by recombination of electrons and holes. The organic light emitting display device has advantages of having a high response speed, having high luminance and a wide viewing angle, and being driven at low power consumption.

The above information disclosed in this Background section is only for understanding of the background of the inventive concepts, and, therefore, it may contain information that does not constitute prior art.

SUMMARY

Illustrative embodiments provide a display device capable of reducing the size of a burr even when a repair process is performed.

Illustrative embodiments also provide a display device capable of preventing the short between an upper display panel and a lower display panel due to a burr.

An embodiment of a display device includes a substrate including a display area and a non-display area disposed around the display area; a fan-out unit disposed in the non-display area and including a first pad unit and a first fan-out line electrically connected to the first pad unit; a first signal line disposed on a different layer from the first fan-out line and including a first area overlapping the first fan-out line; a first switching element disposed on the display area and electrically connected to the first signal line and a first pixel electrode; and a color filter overlapping the first area.

The display device may further include a first connection electrode disposed in the non-display area and formed on the same layer as the first pixel electrode. Here, each of the first fan-out line and the first signal line may include a first extension portion overlapping the first connection electrode, and the first connection electrode may be in direct contact with the first extension portion of the first fan-out line and the first extension portion of the first signal line.

Each of the first fan-out line and the first signal line may include a second extension portion overlapping the first area. Here, the display device may further include a drain electrode portion disposed on the same layer on the first signal line; and a first electrostatic transistor including a control electrode connected to the second extension portion of the first fan-out, one electrode connected to the second extension portion of the first signal line, and another electrode connected to the drain electrode portion.

The display device may further include an electrostatic induction line disposed on the same layer as the first fan-out line. Here, the electrostatic induction line may be electrically connected to the drain electrode portion.

The first signal line may include a third extension portion overlapping the electrostatic induction line. Here, the display device may further include a second electrostatic transistor including a control electrode connected to the electrostatic induction line, one electrode connected to the third extension portion of the first signal line, and another electrode connected to the drain electrode portion.

The color filter may be a blue color filter transmitting blue light.

The color filter may completely cover the first area.

The display device may further include an insulating layer disposed on the color filter. Here, the insulating layer may include an organic material or an inorganic material.

Another embodiment of a display device includes a substrate; a first data fan-out line disposed on the substrate; an electrostatic induction line disposed on the same layer as the first data fan-out line; a first data line disposed on the first data fan-out line and electrically connected to the first data fan-out line; a drain electrode portion disposed on the same layer as the first data line and electrically connected to electrostatic induction line; a color filter disposed on the first data line; and a first electrostatic transistor including a control electrode electrically connected to the first data fan-out line, one electrode electrically connected to the first data line, and another electrode electrically connected to the drain electrode portion. Here, the color filter overlaps the first electrostatic transistor.

The first data fan-out line may include an extension portion connected to the control electrode of the first electrostatic transistor, the first data line may include an extension portion connected to the one electrode of the first electrostatic transistor, and the extension portion of the first data fan-out line, the extension portion of the first data line, and the color filter may overlap each other.

The color filter may completely overlap an area where the extension portion of the first data fan-out line and the extension portion of the first data line overlap each other.

The display device may further include a first pixel electrode disposed on the color filter; and a first connection electrode disposed on the same layer as the first pixel electrode. Here, each of the first fan-out line and the first data line may include an extension portion overlapping the first connection electrode, and the first connection electrode may be in direct contact with the extension portion of the first fan-out line and the extension portion of the first data line.

The first data line may include an extension portion overlapping the electrostatic induction line. Here, the display device may further include a second electrostatic transistor including a control electrode connected to the electrostatic induction line, one electrode connected to the extension portion of the first data line, and another electrode connected to the drain electrode portion.

The color filter may be a blue color filter transmitting blue light.

Another embodiment of a display device includes a substrate; a first data fan-out line disposed on the substrate; a first data line disposed on the first data fan-out line and having a repair area overlapping the first data fan-out line; a color filter disposed on the first data line and overlapping the repair area; and a connection electrode disposed in the repair area and being in direct contact with the first data fan-out line and the first data line.

The color filter may act as a buffer to prevent a short circuit resulting from a burr through the repair area.

The color filter may be a blue color filter transmitting blue light.

The substrate may include a display area for displaying an image and a non-display area disposed around the display area, and the first data fan-out line and the repair area may be disposed in the non-display area.

The display device may further include a first pixel electrode disposed on the color filter; and a first connection electrode disposed on the same layer as the first pixel electrode. Here, each of the first data fan-out line and the first data line may overlap the first connection electrode, and a signal provided to the first data fan-out line may be not provided to the first data line through the first connection electrode.

The color filter may be disposed on the connection electrode.

Therefore, the size of a burr can be reduced when a repair process is performed, and the short between the upper display panel and the lower display panel can be prevented.

However, aspects of the invention are not restricted to the one set forth herein. The above and other aspects of the invention will become more apparent to one of ordinary skill in the art to which the invention pertains by referencing the detailed description of the invention given below.

Additional features of the inventive concepts will be set forth in the description which follows, and in part will be apparent from the description, or may be learned by practice of the inventive concepts.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
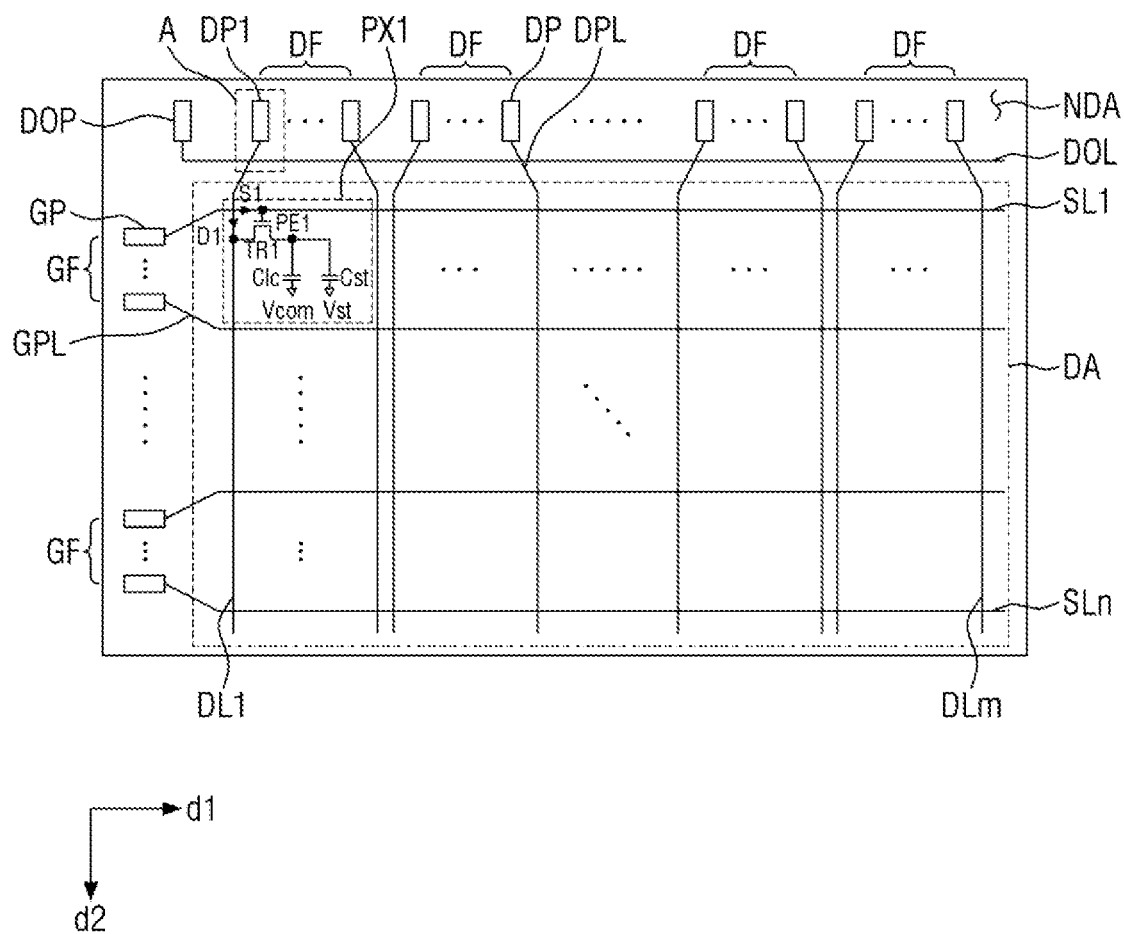
FIG. 1 is a schematic plan view of a display device according to an embodiment of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the d1-axis, the d2-axis, and the d3-axis are not limited to three axes of a rectangular coordinate system, such as the x, y, and z-axes, and may be interpreted in a broader sense. For example, the d1-axis, the d2-axis, and the d3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the illustrative term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein. Hereinafter, embodiments of the invention will be described with reference to the attached drawings.

FIG. 1 is a schematic plan view of a display device according to an embodiment of the invention.

Referring to FIG. 1, a display device according to an embodiment of the invention may include a display area DA and a non-display area NDA.

The display area DA is defined as an area for displaying an image. A plurality of pixel units including a first pixel unit PX1 may be arranged in the display area DA. Further, a plurality of signal lines for providing signals to the plurality of pixel units may be arranged in the display area DA. The plurality of signal lines may include first to n-th scan lines SL1 to SLn (n is a natural number of 1 or more) and first to m-th data lines DL1 to DLm (m is a natural number of 1 or more). Here, the first to n-th scan lines SL1 to SLn may extend in a first direction d1. Further, the first to m-th data lines DL1 to DLm may extend in a second direction d2. In an embodiment, the first direction d1 may intersect the second direction d2. Referring to FIG. 1, the first direction d1 is a row direction, and the second direction d2 is a column direction.

The plurality of pixel units will be described in more detail with reference to the first pixel unit PX1. The first pixel unit PX1 may include a first transistor TR1, a first pixel electrode PE1, a first liquid crystal capacitor Clc, and a first storage capacitor Cst. That is, the display device according to an embodiment of the invention may be a liquid crystal display device. However, the invention is not limited thereto, and this display device may be an organic light emitting display device, a quantum dot display device, or the like. Hereinafter, the display device according to an embodiment of the invention will be described as an example of a liquid crystal display device.

In an embodiment, the first transistor TR1 may be a thin film transistor having an input electrode, an output electrode, and a control electrode. Hereinafter, the input electrode will be referred to as a source electrode, the output electrode will be referred to as a drain electrode, and the control electrode will be referred to as a gate electrode.

The first transistor TR1 includes a gate electrode electrically connected to the first scan line SL1, a source electrode electrically connected to the first data line DL1, and a drain electrode electrically connected to the first pixel electrode PE1. Here, the drain electrode of the first transistor TR1 may be electrically connected to the first pixel electrode PE1. The first transistor TR1 performs a switching operation based on a first scan signal S1 received from the first scan line SL1 to transmit a first data signal D1 received from the first data line DL1 to the first pixel electrode PE1.

The first liquid crystal capacitor Clc is formed between the first pixel electrode PE1 and a common electrode CE (refer to FIG. 3) to which a common voltage Vcom is applied. The first storage capacitor Cst is formed between the first pixel electrode PE1 and a storage line to which a storage voltage Vcst is applied. The first storage capacitor Cst may be omitted.

The non-display area NDA is defined as an area that is disposed around the display area DA and does not display an image. In an embodiment, the non-display area NDA may be disposed to surround the outer periphery of the display area DA. However, the positions where the display area DA and the non-display area NDA are disposed are not limited to those shown in FIG. 1.

A plurality of data fan-out units DF, a plurality of gate fan-out units GF, and an electrostatic induction line DOL may be arranged in the non-display area NDA.

Each of the plurality of data fan-out units DF may include a plurality of data fan-out lines DPL and a plurality of data pad units DP. One end of each of the plurality of data fan-out lines DPL may be electrically connected to each of the corresponding plurality of data pad units DP. Further, the other end of each of the plurality of data fan-out lines DPL may be electrically connected to each of the corresponding first to m-th data lines DL1 to DLm in the non-display area NDA. The plurality of data fan-out lines DPL are disposed on different layers from the first to m-th data lines DL1 to DLm. Accordingly, the other end of each of the plurality of data fan-out lines DPL may be electrically connected to each of the corresponding first to m-th data lines DL1 to DLm through a separate connection electrode (for example, CE1 in FIG. 4). Details thereof will be described later with reference to FIG. 4.

The plurality of data pad units DP may be electrically connected to a driving integrated circuit. Here, the driving integrated circuit connected to the plurality of data pad units DP may be a data driver. The data driver may generate a plurality of data signals based on image data and control signals received from the outside and transmit the data signals to the first to m-th data lines DL1 to DLm. In an embodiment, the data driver may include a shift register, a latch, and a digital-analog converter.

Each of the plurality of gate fan-out units GF may include a plurality of gate fan-out lines GPL and a plurality of gate pad units GP. One end of each of the plurality of gate fan-out lines GPL may be electrically connected to each of the corresponding plurality of gate pad units GP. Further, the other end of each of the plurality of gate fan-out lines GPL may be electrically connected to each of the corresponding first to m-th scan lines SL1 to SLn in the non-display area NDA. However, since the plurality of gate fan-out lines GPL are arranged on the same layer as the first to nth scan lines SL1 to SLn, a connecting electrode for connecting the plurality of gate fan-out lines GPL and the first to the n-th scan lines SL1 to SLn is not required.

In an embodiment, the plurality of gate pad units GP may be electrically connected to a scan driver including a plurality of transistors. Here, the scan driver may generate a plurality of scan signals based on the control signals received from the outside and transmit the scan signals to the first to n-th scan lines SL1 to SLn. In another embodiment, the scan drive may be formed as a driving integrated circuit.

Hereinafter, since the plurality of data fan-out units DF and the plurality of gate fan-out units GF are similar to each other in structure, the plurality of data fan-out units DF will be described as an example.

In an embodiment, the intervals between the plurality of data fan-out lines DPL may be narrower from the plurality of data pad units DP toward the first to m-th data lines DL1 to DLm. Further, at least some of the plurality of data fan-out lines DPL may be formed in a zigzag pattern in order to minimize the signal delay deviation due to RC delay between each other. That is, the signal delay deviation between the plurality of data fan-out lines DPL is compensated by increasing the number of zigzag patterns from the edge toward the center with reference to FIG. 1.

The electrostatic induction line DOL may extend along the first direction d1. The electrostatic induction line DOL may be electrically connected to an electrostatic induction pad unit DOP to receive a predetermined voltage from the outside. The electrostatic induction line DOL corresponds to a component constituting an electrostatic discharge prevention unit ESD (refer to FIG. 4) to be described later. Details thereof will be described later with reference to FIG. 4.

Hereinafter, descriptions will be made in more detail on the basis of the first pixel unit PX1 in the case of components arranged in the display area DA, and on the basis of the area A in the case of components arranged in the non-display area NDA. Meanwhile, in FIGS. 6, 7, and 8, for convenience of explanation, the components arranged in the first pixel unit PX1 and the components arranged in the area A are shown together in one drawing. Hereinafter, the data pad unit DP and the data fan-out line DPL electrically connected to the first data line DL1 will be referred to as a first data pad unit DP1 and a first data fan-out line DPL1, respectively.

Figure 2:
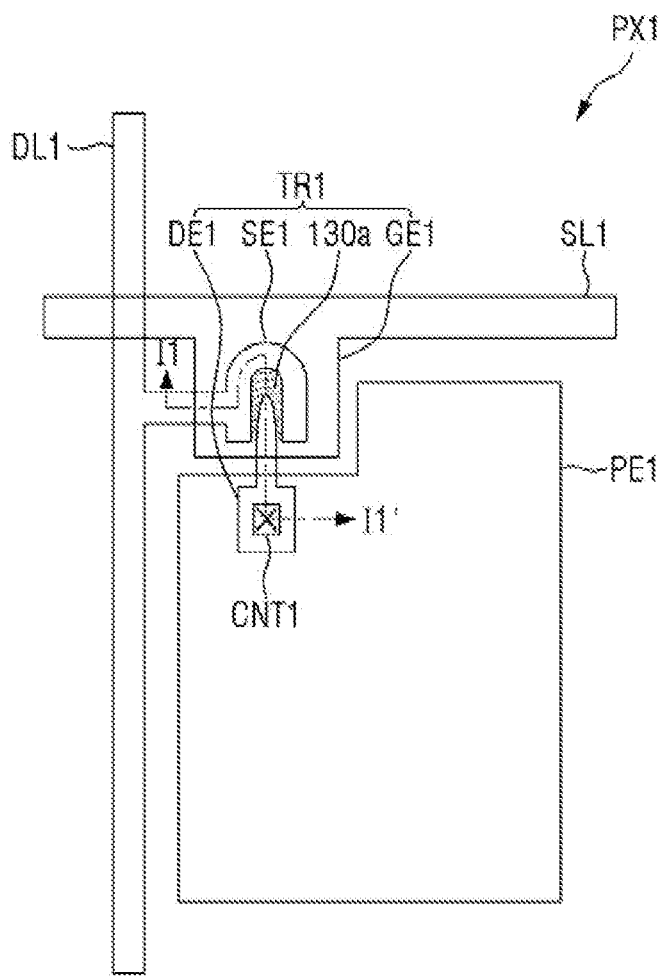
FIG. 2 is a layout diagram showing the first pixel unit shown in FIG. 1 in more detail.
Figure 3:
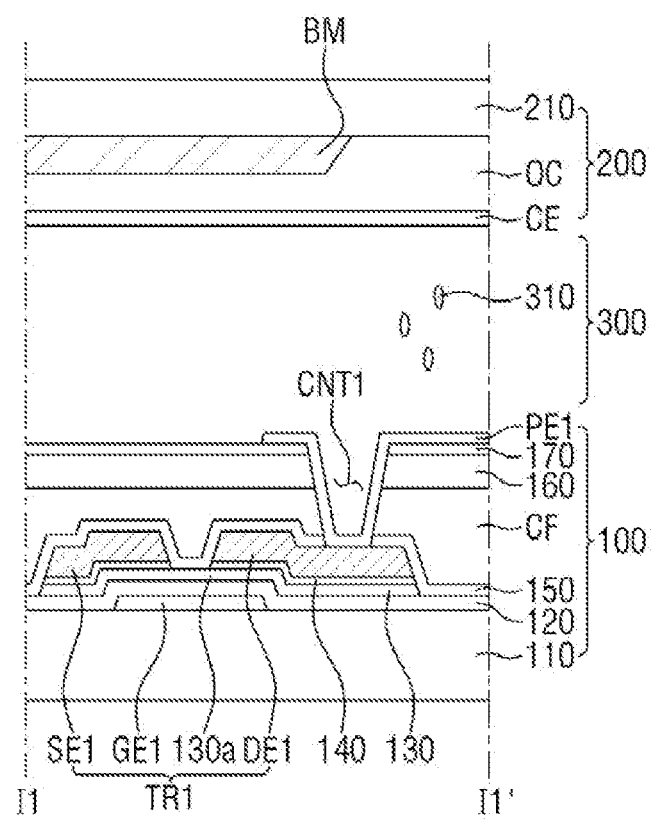
FIG. 3 is a cross-sectional view taken along the line I1-I1'.
Figure 4:
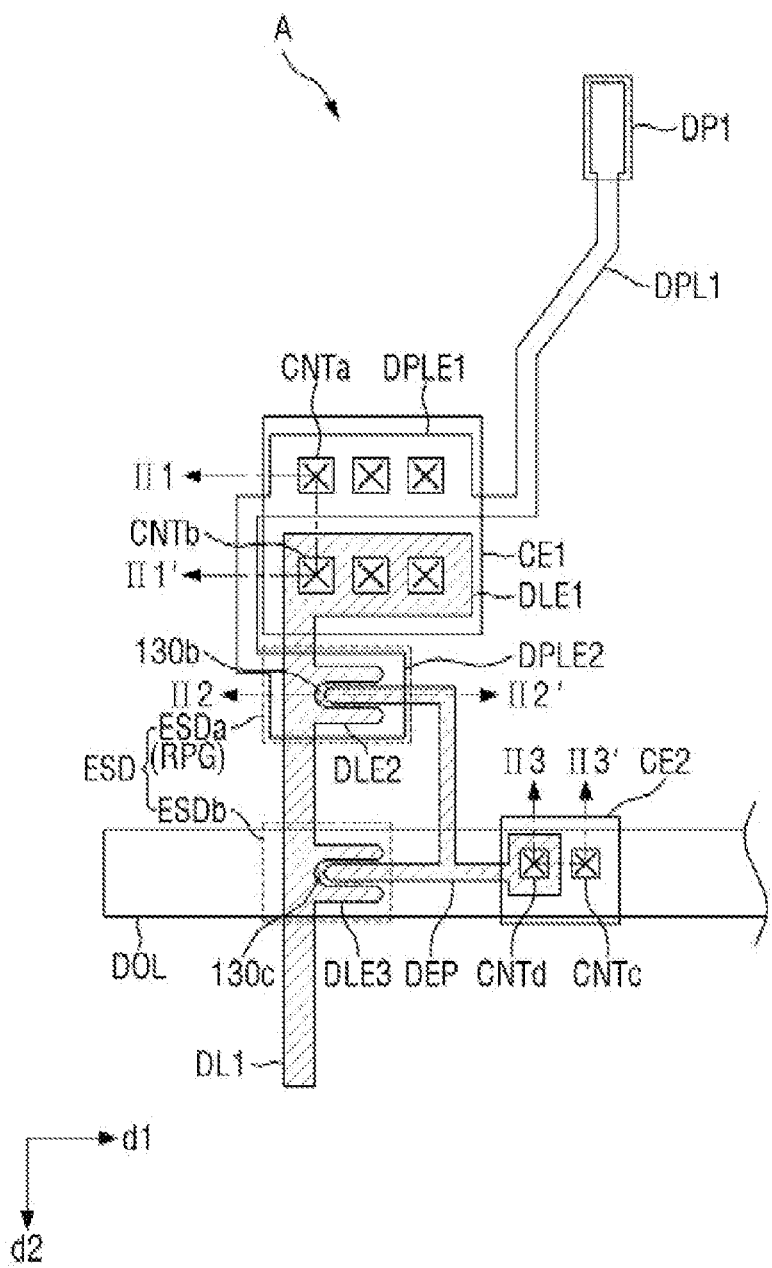
FIG. 4 is a layout diagram showing the area A shown in FIG. 1 in more detail.
Figure 5:
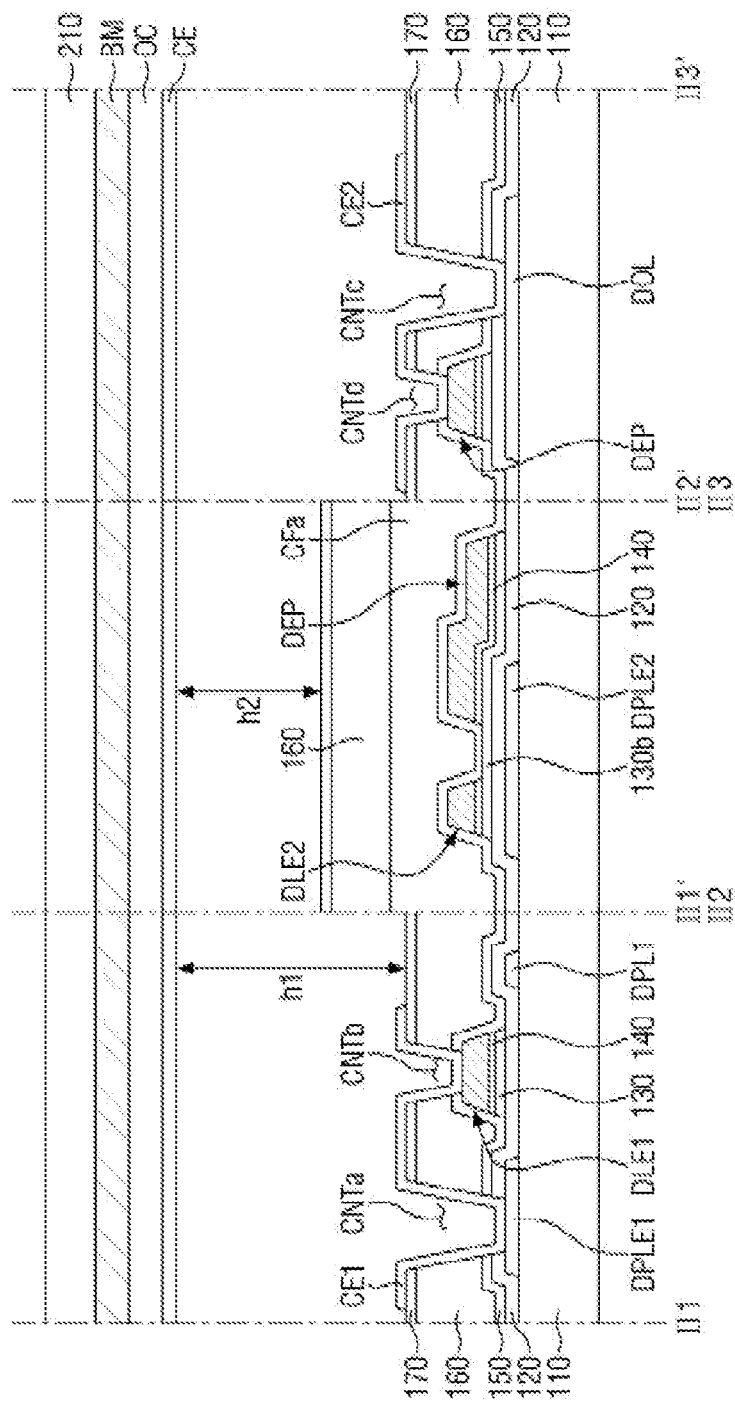
FIG. 5 is a cross-sectional view taken along lines II1-II1', II2-II2' and II3-II3' shown in FIG. 4.
Figure 6:
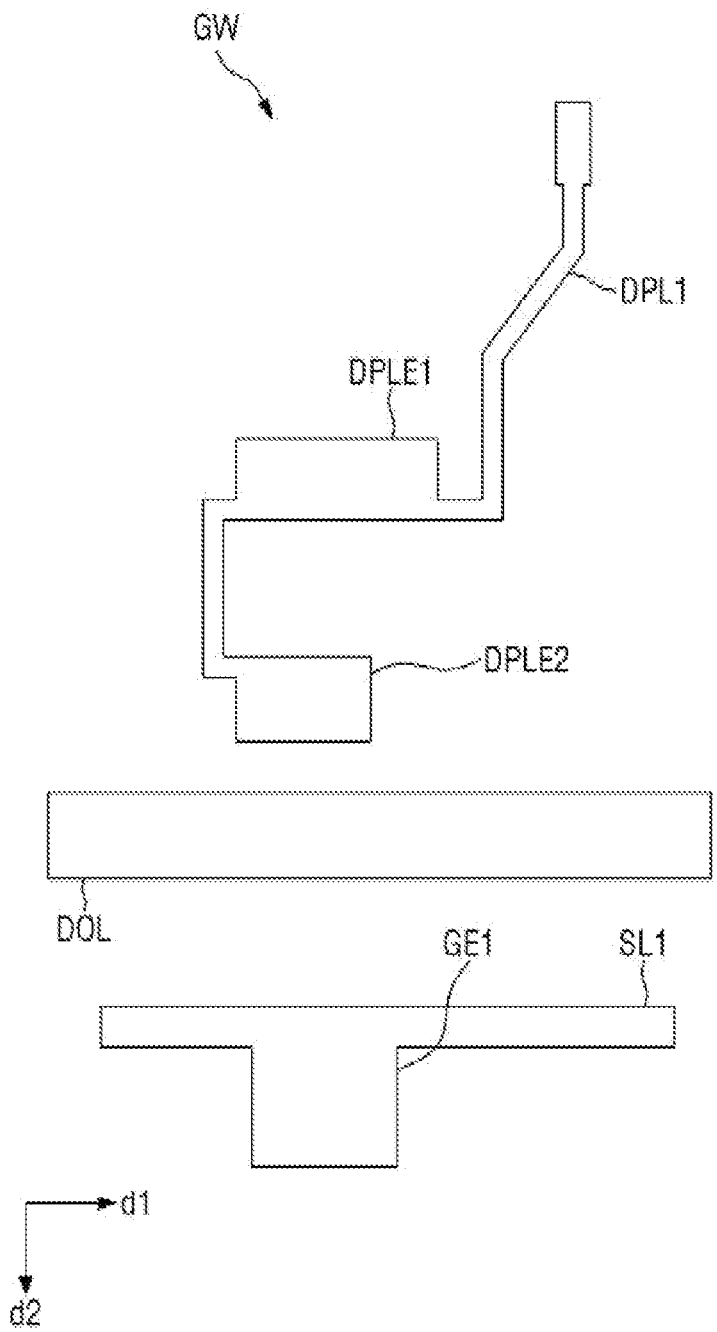
FIG. 6 is a diagram showing a gate conductor together with the configuration shown in FIGS. 2 and 4.
Figure 7:
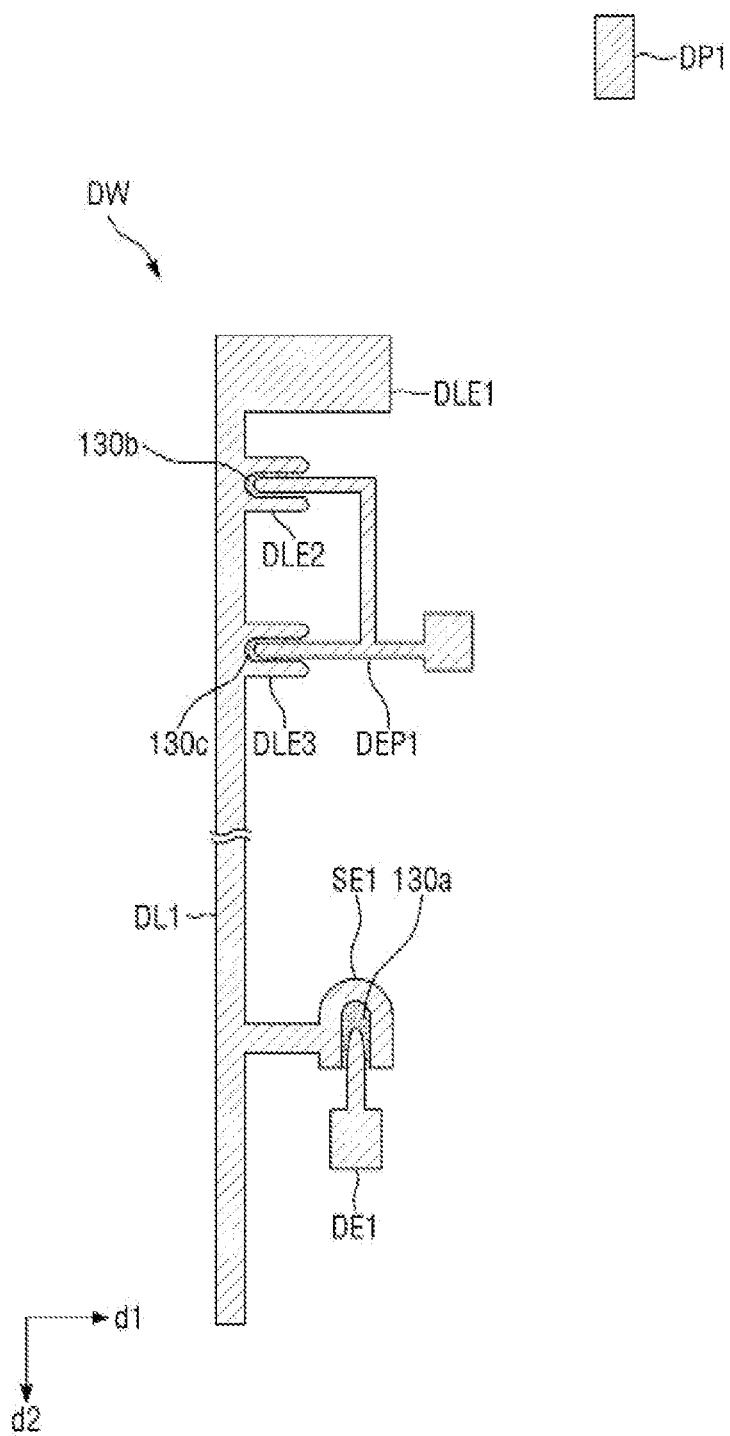
FIG. 7 is a diagram showing a data conductor together with the configuration shown in FIGS. 2 and 4.
Figure 8:
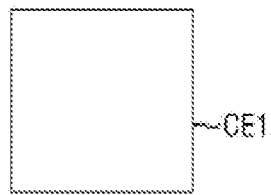
FIG. 8 is a diagram showing a transparent conductor together with the configuration shown in FIGS. 2 and 4 on the same layer.
Figure 8:
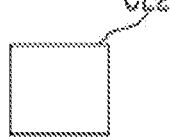
Figure 8:
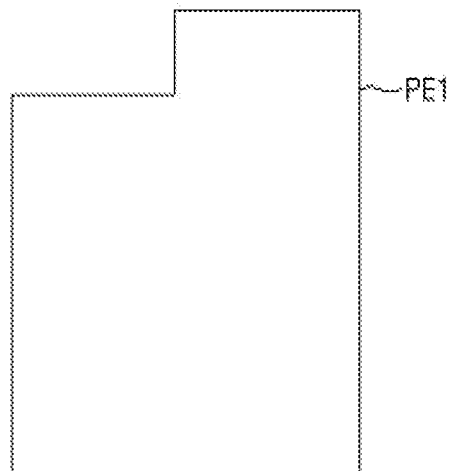

FIG. 2 is a layout diagram showing the first pixel unit shown in FIG. 1 in more detail. FIG. 3 is a cross-sectional view taken along the line I1-I1'. FIG. 4 is a layout diagram showing the area A shown in FIG. 1 in more detail. FIG. 5 is a cross-sectional view taken along lines II1-II1', II2-II2' and II3-II3' shown in FIG. 4. FIG. 6 is a diagram showing a gate conductor together with the configuration shown in FIGS. 2 and 4. FIG. 7 is a diagram showing a data conductor together with the configuration shown in FIGS. 2 and 4. FIG. 8 is a diagram showing a transparent conductor together with the configuration shown in FIGS. 2 and 4 on the same layer.

A lower display panel 100 is disposed to face an upper display panel 200. A liquid crystal layer 300 is interposed between the lower display panel 100 and the upper display panel 200. The liquid crystal layer 300 may include a plurality of liquid crystal molecules 310. In an embodiment, the lower display panel 100 may be attached to the upper display panel 200 through sealing.

First, the lower display panel 100 will be described.

In an embodiment, a first substrate 110 may be a transparent insulating substrate. Here, the transparent insulating substrate may include a glass material, a quartz material, or a translucent plastic material. In another embodiment, the first substrate 110 may be a flexible substrate, or may a laminate of a plurality of films.

A gate conductor GW as shown in FIG. 6 may be disposed on the first substrate 110. The gate conductor GW includes first to n-th scan lines SL1 to SLn including a first scan line SL1, a first gate electrode GE1, an electrostatic induction line DOL, a plurality of data fan-out lines DPL including a first data fan-out line DPL1, and a plurality of gate fan-out lines GPL.

The first gate electrode GE1 is directly connected to the first scan line SL1. The first gate electrode GE1 may extend from the first scan line SL1 toward a first semiconductor pattern 130a.

One end of the first data fan-out line DPL1 may overlap the first data pad unit DP1 to be electrically connected to the first data pad unit DP1. The other end of the first data fan-out line DPL1 may overlap at least a part of the first data line DL1. In this specification, the expression "overlap" refers to overlap in the vertical direction with respect to the first substrate 110, unless otherwise defined.

This will be described in more detail with regard to FIG. 4. The first data fan-out line DPL1 may include a first extension portion DPLE1 and a second extension portion DPLE2. The first extension portion DPLE1 of the first data fan-out line DPL1 may be electrically connected to a first extension portion DLE1 of the first data line DL1 through a first connection electrode CE1. The second extension portion DPLE2 of the first data fan-out line DPL1 may overlap a second extension portion DLE2 of the first data line DL1 and the drain electrode portion DEP.

The electrostatic induction line DOL may extend in the first direction d1. The electrostatic induction line DOL may overlap a third extension portion DLE3 of the first data line DL1. Further, the electrostatic induction line DOL may at least partially overlap the drain electrode portion DEP, and may be electrically connected to the drain electrode portion DEP through a second connection electrode CE2.

The gate conductor GW may be formed of a single film including one conductive metal selected from aluminum (Al), copper (Cu), molybdenum (Mo), chromium (Cr), titanium (Ti), tungsten (W), molybdenum tungsten (MoW), molybdenum titanium (MoTi), and copper/molybdenum titanium (Cu/MoTi), a double film including two conductive metals selected therefrom, or a triple film including three conducive metals selected therefrom. The plurality of conductive lines included in the gate conductor GW may be simultaneously formed through the same mask process.

A gate insulating layer 120 may be disposed on the gate conductor GW. The gate insulating layer 120 may be formed of silicon nitride, silicon oxide, or the like. The gate insulating layer 120 may have a multi-layer structure including at least two insulating layers having different physical properties.

A data conductor DW may be disposed on the gate insulating layer 120. The data conductor DW includes a plurality of data lines including a first data line DL1, a first source electrode SE1, a first drain electrode DE1, a plurality of data pad units DP including a first data pad unit DP1, a semiconductor layer 130 including first to third semiconductor patterns 130a, 130b, and 130c, and a drain electrode portion DEP.

The first data line DL1 may include the aforementioned first to third extension portions DLE1 to DLE3.

As described above, the first extension portion DLE1 of the first data line DL1 may be connected to the first data fan-out line DPL1, more specifically, the first extension portion DPLE1 of the first data fan-out line DPL1, through the first connection electrode CE1. For this purpose, at least one contact hole CNTa exposing at least a part of the first extension DPLE1 of the first data fan-out line DPL1 to the outside and at least one contact hole CNTb exposing at least a part of the first extension portion DLE1 of the first data line DL1 to the outside may be formed.

The second extension portion DLE2 of the first data line DL1, the second extension portion DPLE2 of the first data fan-out line DPL1, the second semiconductor pattern 130b, and the drain electrode portion DEP may form a first electrostatic transistor ESDa. That is, the second extension portion DPLE2 of the first data fan-out line DPL1 may serve as a gate electrode of the first electrostatic transistor ESDa. The second extension portion DLE2 of the first data line DL1, overlapping the second extension portion DPLE2 of the first data fan-out line DPL1, may serve as a source electrode of the first electrostatic transistor ESDa. Further, a region of the drain electrode portion DEP, surrounded by the second extension portion DLE2 of the first data line DL1 may serve as a drain electrode of the first electrostatic transistor ESDa.

The third extension portion DLE3 of the first data line DL1, the electrostatic induction line DOL, the third semiconductor pattern 130c, and the drain electrode portion DEP may form a second electrostatic transistor ESDb.

Although it is shown in FIG. 4 that the second extension portion DLE2 and third extension portion DLE3 of the first data line DL1 are U-shaped and a part of the drain electrode portion DEP is surrounded by each of the second extension portion DLE2 and third extension portion DLE3 of the first data line DL1, the invention is not limited thereto.

The first electrostatic transistor ESDa and the second electrostatic transistor ESDb may constitute an electrostatic discharge prevention unit ESD. The electrostatic discharge prevention unit ESD may disperse the static electricity introduced from the outside. Meanwhile, although not shown in the drawing, the electrostatic discharge prevention unit ESD may further include an electrostatic capacitor for inducing and charging static electricity.

The drain electrode portion DEP serves as a drain electrode of each of the first electrostatic transistor ESDa and the second electrostatic transistor ESDb. The drain electrode portion DEP may be electrically connected to the electrostatic induction line DOL through the second connection electrode CE2. For this purpose, at least one contact hole CNTc exposing at least a part of the electrostatic induction line DOL and at least one contact hole CNTd exposing at least a part of the drain electrode DEP may be formed.

The first source electrode SE1 may be branched from the first data line DL1, and thus at least a part thereof may overlap the first gate electrode GE1. The first drain electrode DE1 may overlap the first gate electrode GE1, and may be disposed to be spaced apart from the first source electrode SE1 by a predetermined distance. At least a part of the first drain electrode DE1 may be exposed to the outside through the first contact hole CNT1 to be in contact with the first pixel electrode PE1.

Although it is shown in FIG. 2 that the first source electrode SE1 is U-shaped and the first drain electrode DE1 is surrounded by the first source electrode SE1, but the invention is not limited thereto. The first source electrode SE1, the first drain electrode DE1, the first semiconductor pattern 130a, and the first gate electrode GE1 form the aforementioned first transistor TR1.

A semiconductor layer 130 may be disposed on the gate insulating layer 120. In an embodiment, the semiconductor layer 130 may be formed of amorphous silicon, polycrystalline silicon, or the like. In another embodiment, the semiconductor layer 130 may include an oxide semiconductor. When the semiconductor layer 130 includes an oxide semiconductor, the semiconductor layer 130 may be formed of any one oxide semiconductor selected from IGZO (In—Ga-Zinc-Oxide), ZnO, $ZnO_2$, CdO, SrO, $SrO_2$, CaO, $CaO_2$, MgO, $MgO_2$, InO, $In_2O_3$, GaO, $Ga_2O$, $Ga_2O_3$, SnO, $SnO_2$, GeO, $GeO_2$, PbO, $Pb_2O_3$, $Pb_3O_4$, TiO, $TiO_2$, $Ti_2O_3$, and $Ti_3O_5$.

As described above, the first semiconductor pattern 130a of the semiconductor layer 130 may form a channel region of the first transistor TR1. Further, the second semiconductor pattern 130b of the semiconductor layer 130 may form a channel region of the first electrostatic transistor ESDa, and the third semiconductor pattern 130c of the semiconductor layer 130 may form a channel region of the second electrostatic transistor ESDb.

The first data pad unit DP1 may be disposed on the first data fan-out line DPL1, and may be electrically connected to the first data fan-out line DPL1. For this purpose, a contact hole exposing at least a part of the first data fan-out line DPL1 may be formed.

The data conductor DW may further include an ohmic contact layer 140. The ohmic contact layer 140 may be disposed on the semiconductor layer 130. The ohmic contact layer 140 may be made of a material such as n+ hydrogenated amorphous silicon, which is doped with a high concentration of n-type impurity such as phosphorus, or may be made of silicide. However, the ohmic contact layer 140 may be omitted if the semiconductor layer 130 is made of an oxide semiconductor. Hereinafter, in the specification, a case where the data conductor DW includes the ohmic contact layer 140 will be described.

The data conductor DW may be formed of a single film including one conductive metal selected from aluminum (Al), copper (Cu), molybdenum (Mo), chromium (Cr), titanium (Ti), tungsten (W), molybdenum tungsten (MoW), molybdenum titanium (MoTi), and copper/molybdenum titanium (Cu/MoTi), a double film including two conductive metals selected therefrom, or a triple film including three conducive metals selected therefrom. However, the invention is not limited thereto, and the data conductor DW may be made of various metals or conductors. In an embodiment, the data conductor DW may be simultaneously formed through the same mask process.

The first passivation layer 150 may be disposed on the data conductor DW. The first passivation layer 150 includes an opening exposing at least a part of the first drain electrode DE1. In an embodiment, the first passivation layer 150 may be formed of an inorganic insulating material such as silicon nitride or silicon oxide. The first passivation layer 150 may prevent pigment of an organic insulating layer 160, which will be described later, from flowing into the first to third semiconductor patterns 130a to 130c.

A color filter CF may be disposed on the first passivation layer 150. Light passed through the color filter CF may express one of three primary colors such as red, green, and blue. However, the color of the light passing through the color filter CF is not limited to the primary colors, and may be any one of cyan, magenta, yellow, and white colors. The color filter CF may be formed of a material that expresses different colors for adjacent pixel units.

The color filter CF may be disposed in each of the display area DA and the non-display area NDA. The color filter CF is disposed to overlap the plurality of pixel electrodes in the display area DA. Further, the color filter CF is disposed to overlap the first electrostatic transistor ESDa in the non-display area NDA. Hereinafter, for convenience of explanation, the color filter CF overlapping the first electrostatic transistor ESDa will be indicated by the reference numeral "Cfa".

This will be described in more detail with reference to FIGS. 4 and 5. The color filter CFa is disposed to cover an area where the second extension portion DPLE2 of the first data fan-out line DPL1 and the second extension portion DLE2 of the first data line DL1 overlap each other. Hereinafter, the area where the second extension portion DPLE2 of the first data fan-out line DPL1 and the second extension portion DLE2 of the first data line DL1 overlap each other will be referred to as a "repair area RPG".

That is, the color filter CFa is disposed on the repair area RPG, and overlaps the second extension portion DPLE2 of the first data fan-out line DPL1 and the second extension portion DLE2 of the first data line DL1. In an embodiment, the color filter CFa may be disposed to completely cover the repair area RPG. Accordingly, due to the step formed by the color filter CFa, the cell gap h2 of an area where the color filter CFa is disposed in the non-display area NDA becomes narrower than the cell gap h1 of an area where the color filter CFa is not disposed in the non-display area NDA.

In an embodiment, the color filter CFa may be a blue color filter transmitting blue light. However, the invention is not limited thereto, and the color filter CFa may be a color filter transmitting different color light.

The repair area RPG is also defined as an area where a repair process is performed to compensate for damage or the like of the first connection electrode CE1. Here, the repair process may be a laser short process. More specifically, as described above, the first connection electrode CE1 serves as a medium for electrically connecting the first data fan-out line DPL1 and the first data line DL1 to each other. However, when the first connection electrode CE1 is damaged due to static electricity or the like, the first data fan-out line DPL1 and the first data line DL1 may not be electrically connected to each other. In this case, a necessary data signal is not provided to the first data line DL1, and thus a desired image may not be displayed properly. In this case, a repair process of shorting the second extension portion DPLE2 of the first data fan-out line DPL1 and the second extension portion DLE2 of the first data line DL1, overlapping each other, may be performed in the repair area RPG by the laser short process. That is, if the repair process is not required, the repair area RPG may operate as the first electrostatic transistor ESDa to disperse static electricity. In contrast, if the repair process is required, the repair process may be performed in the repair area RPG.

Meanwhile, a burr may be formed in the repair area RPG where the laser shot process is performed. A short may occur between the lower display panel 100 and the upper display panel 200 due to the burr. For example, when the repair area RPG is exposed to additional pressurized environment after performing the laser short process, there may be a problem that the lower display panel 100 and the upper display panel are brought into contact with each other by the formed burr to be shorted.

The color filter CFa may be disposed on the repair area RPG to serve as a buffer member capable of reducing the size of a burr by the repair process. Further, the color filter CFa may maintain a cell gap between the lower display panel 100 and the upper display panel 200 by forming a step in the repair area RPG. Thus, the cell gap between the lower display panel 100 and the upper display panel 200 may be maintained, thereby preventing the short therebetween.

The case where the color filter CFa is disposed in the repair area RPG has been described above, but the invention is not limited thereto. That is, instead of the color filter Cfa, an insulating pattern including an organic material or an inorganic material may be disposed in the repair area RPG.

An organic insulating layer 160 may be disposed on the first passivation layer 150 and the color filter CF. The organic insulating layer 160 may have excellent planarization characteristics, and may include an organic material having photosensitivity. The organic insulating layer 160 may be omitted.

A second passivation layer 170 may be disposed on the organic insulating layer 160. In an embodiment, the second passivation layer 170 may be formed of an inorganic insulating material such as silicon nitride or silicon oxide. The second passivation layer 170 may be omitted.

The transparent conductor TE may be disposed on the second passivation layer 170. The transparent conductor TE may include a transparent conductive material. Here, the transparent conductive material may include polycrystalline, monocrystalline or amorphous indium tin oxide (ITO). The transparent conductor TE may include a plurality of pixel electrodes including a first pixel electrode PE1, a first connection electrode CE1, and a second connection electrode CE2. In an embodiment, the plurality of pixel electrodes, the first connection electrode CE1, and the second connection electrode CE2 may be simultaneously formed by the same mask process. The plurality of pixel electrodes, the first connection electrode CE1, and the second connection electrode CE2 are disposed on the same layer, but are physically and electrically insulated. Meanwhile, unlike that shown in the drawing, the first pixel electrode PE1 may include a plurality of slits.

A first alignment film may be disposed on the transparent conductor TE. The first alignment film may induce the initial alignment of a plurality of liquid crystal molecules in the liquid crystal layer 300. In an embodiment, the first alignment film may include an organic polymer material having an imide group in the repeating unit of the main chain thereof.

Next, the upper display panel 200 will be described.

A second substrate 210 is disposed to face the first substrate 110. The second substrate 210 may be formed of transparent glass or plastic. In an embodiment, the second substrate 210 may be formed of the same material as the first substrate 110.

A black matrix BM may be disposed on the second substrate 210. The black matrix BM may overlap an area other than a pixel area for displaying an image, that is, a non-pixel area. The black matrix BM can prevent light from being transmitted to the non-pixel area. The material of the black matrix BM is not particularly limited as long as it can block light. In an embodiment, the black matrix BM may be formed of a photosensitive composition, an organic material, or a metallic material. In an embodiment, the photosensitive composition may include a binder resin, a polymerizable monomer, a polymerizable oligomer, a pigment, and a dispersant. The metallic material may include chromium.

A planarization layer OC may be disposed on the black matrix BM. The planarization layer OC may keep a common electrode CE flat. The material of the planarization layer OC is not particularly limited, and, in an embodiment, may include an organic material or an inorganic material.

The common electrode CE may be disposed on the planarization layer OC. At least a part of the common electrode CE may overlap the first pixel electrode PE1. In an embodiment, the common electrode CE may be formed in the shape of a plate. However, the invention is not limited thereto, and the common electrode CE may include a plurality of slits. In an embodiment, the common electrode CE may be formed of a transparent conductive material such as ITO or IZO, or a reflective metal such as aluminum, silver, chromium, or an alloy thereof.

A second alignment film may be disposed on the common electrode CE. The second alignment film may induce the initial alignment of a plurality of liquid crystal molecules in the liquid crystal layer 300. In an embodiment, the second alignment film may be formed of the same material as the first alignment film.

Next, the liquid crystal layer 300 will be described.

The liquid crystal layer 300 includes a plurality of liquid crystal molecules 310. In an embodiment, the plurality of liquid crystal molecules 310 may have a negative dielectric anisotropy and may be vertically aligned in an initial alignment state. The plurality of liquid crystal molecules 310 may have a predetermined pretilt angle in the initial alignment state. The initial alignment of the plurality of liquid crystal molecules 310 may be induced by the aforementioned first and second alignment films. When an electric field is formed between the lower display panel 100 and the upper display panel 200, the plurality of liquid crystal molecules 310 may change the polarization state of the light passing through the liquid crystal layer 300 by tilting or rotating in a specific direction.

Next, a display device according to another embodiment of the invention will be described with reference to FIGS. 9 and 10. However, for convenience of explanation, a description will be made with reference to the area A in FIG. 1, but it will be referred to as area A'. A description of contents repeating those having been described in FIGS. 1 to 8 will be omitted.

Figure 9:
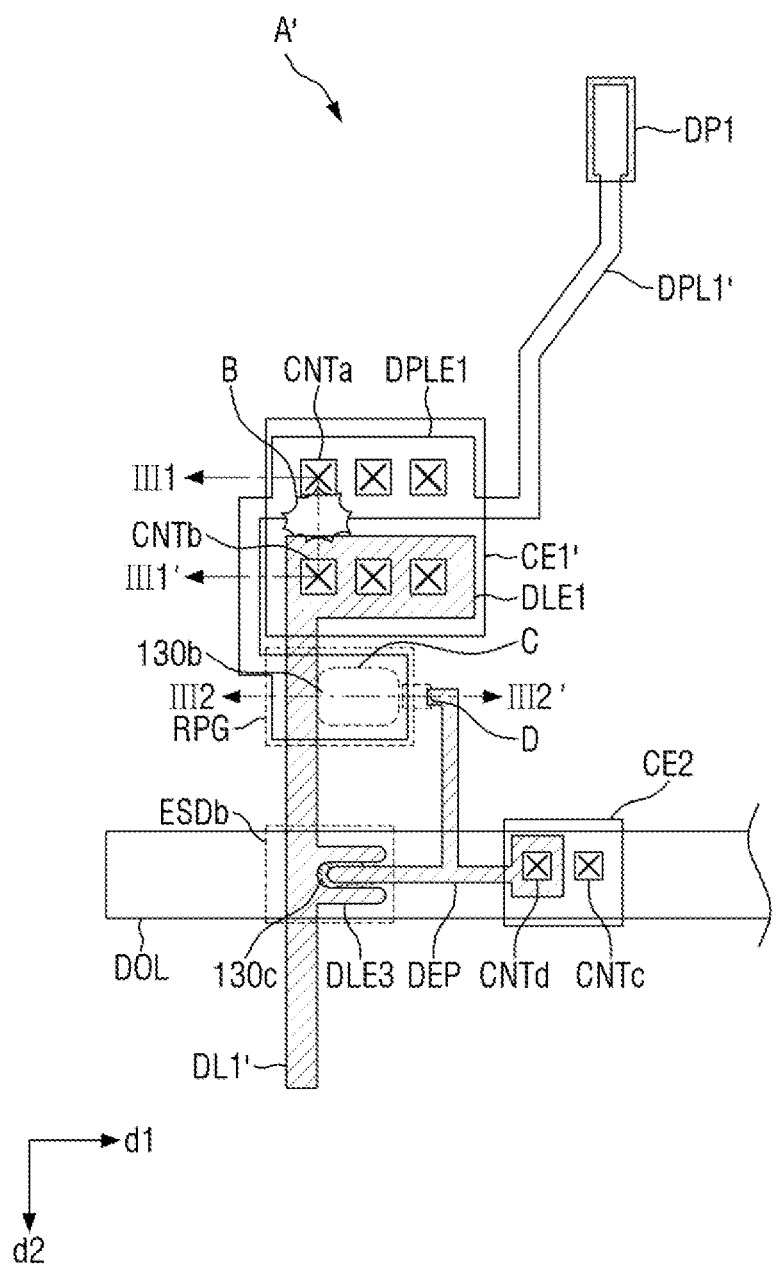
FIGS. 9 and 10 are views illustrating a display device according to another embodiment.
Figure 10:
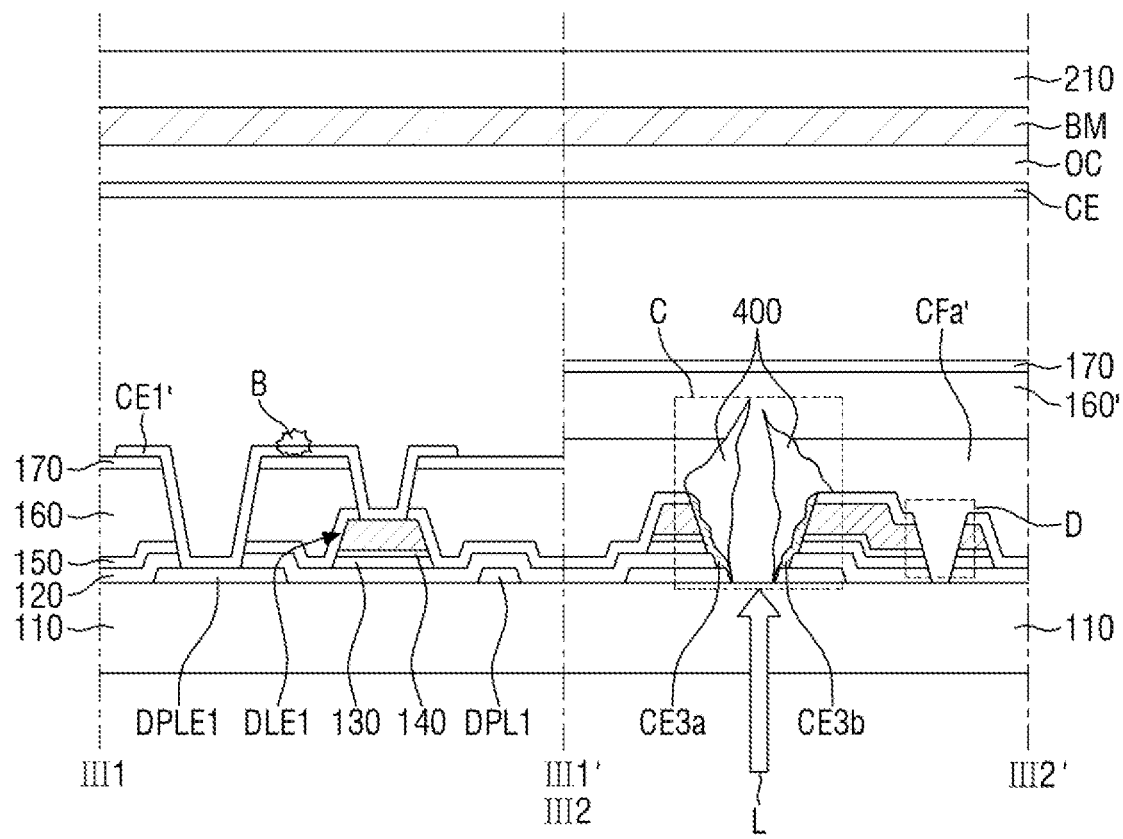

FIGS. 9 and 10 are views for explaining a display device according to another embodiment. Here, the display device shown in FIGS. 9 and 10 is a display device where the aforementioned repair process was performed.

Referring to FIGS. 9 and 10, a first connection electrode CE1' may be damaged due to static electricity or the like. The area B shown in FIGS. 9 and 10 indicates an area disconnected due to the damage. Accordingly, a first data fan-out line DPL1' and a first data line DL1' are not electrically connected to each other through the first connection electrode CE1'.

Thus, a repair process is performed in the repair area RPG, more specifically, in the area C shown in FIGS. 9 and 10, so that the first data fan-out line DPL1 and the first data line DL1' may be electrically connected to each other in the repair area RPG. More specifically, a welding process is performed in the repair area RPG through a laser L, and thus the first data fan-out line DPL1' and the first data line DL1' may be electrically connected to each other through third connection electrodes CE3$a$ and CE3$b$. In an embodiment, the laser L may be a nanosecond laser.

That is, the first data fan-out line DPL1' and the first data line DL1' may be electrically connected to each other through the third connection electrodes CE3a and CE3b in the repair area RPG.

Meanwhile, the burr 400 may be formed by the laser process. In an embodiment, the burr 400 may have a through-hole shape. However, as described above with reference to FIG. 5, a color filter CFa' formed on the repair area RPG serves as a buffer member, thereby preventing the size of the burr 400 from relatively increasing. Further, the cell gap between the lower display panel 100 and the upper display panel 200 is maintained due to a step formed by the color filter CFa', thereby preventing a short from occurring between the lower display panel 100 and the upper display panel 200.

Although it is shown in FIG. 10 that the burr 400 penetrates both the color filter CFa' and the organic insulating layer 160, the invention is not limited thereto. The burr 400 may be able to penetrate only the color filter CFa' through a method of adjusting the thickness of the color filter CFa'.

Meanwhile, as described above, before the repair process, the drain electrode portion DEP of the first electrostatic transistor ESDa (refer to FIG. 4) serves as a drain electrode. However, when the repair process is performed, the first data fan-out line DPL1' and the first data line DL1' are electrically connected to each other within the repair area RPG through the third connection electrodes CE3a and CE3b, so that, in order to avoid signal interference therewith, at least a part of a drain electrode portion DEP' having served as the drain electrode of the first electrostatic transistor ESDa (refer to FIG. 4) may be physically disconnected. The area D shown in FIGS. 9 and 10 represents an area where at least a part of the drain electrode portion DEP' having served as a drain electrode may be physically disconnected. The method of physically disconnecting at least a part of the drain electrode portion DEP' is not particularly limited. In an embodiment, at least a part of the drain electrode portion DEP' may be physically disconnected by a laser process. Thus, after the repair process is performed, the first electrostatic transistor ESDa no longer performs an operation for electrostatic dispersion.

Since the repair process can be performed in an area requiring repair, the display device shown in FIGS. 9 and 10 may include both an area where the repair is performed and an area where the repair is not performed.

As described above, according to the embodiments of the invention, the size of a burr can be reduced when a repair process is performed, and the short between the upper display panel and the lower display panel can be prevented.

Although certain illustrative embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
  a substrate;
  a first data fan-out line disposed on the substrate;
  a first data line disposed on the first data fan-out line and comprising a repair area overlapping the first data fan-out line;
  a color filter disposed on the first data line and overlapping the repair area; and
  a connection electrode disposed in the repair area and being in direct contact with the first data fan-out line and the first data line.

2. The display device of claim 1, wherein the color filter comprises is configured as a buffer to prevent a short circuit resulting from a burr through the repair area.

3. The display device of claim 1, wherein the color filter is a blue color filter transmitting blue light.

4. The display device of claim 1, wherein the substrate comprises a display area for displaying an image and a non-display area disposed around the display area, and
  wherein the first data fan-out line and the repair area are disposed in the non-display area.

5. The display device of claim 1, further comprising:
  a first pixel electrode disposed on the color filter; and
  a first connection electrode disposed on a same layer as the first pixel electrode,
  wherein each of the first data fan-out line and the first data line overlaps the first connection electrode, and
  a signal provided to the first data fan-out line is not provided to the first data line through the first connection electrode.

6. The display device of claim 1, wherein the color filter is disposed on the connection electrode.

7. The display device of claim 1, wherein the color filter overlaps the entirety of the repair area.

* * * * *